(12) United States Patent
Yamada

(10) Patent No.: US 9,209,799 B2
(45) Date of Patent: Dec. 8, 2015

(54) SWITCH AND SWITCH CIRCUIT USING THE SAME

(75) Inventor: Kouichi Yamada, Gifu-ken (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 551 days.

(21) Appl. No.: 13/428,867

(22) Filed: Mar. 23, 2012

(65) Prior Publication Data

US 2012/0243712 A1    Sep. 27, 2012

(30) Foreign Application Priority Data

Mar. 24, 2011  (JP) ................................. 2011-066490

(51) Int. Cl.
*H03K 17/687*    (2006.01)
*H03K 17/0814*    (2006.01)

(52) U.S. Cl.
CPC ...... *H03K 17/6874* (2013.01); *H03K 17/08142* (2013.01); *H03K 2217/0054* (2013.01)

(58) Field of Classification Search
CPC ............... H03K 17/04123; H03K 2217/0036; H03K 17/687
USPC ................... 327/407, 408, 427, 434
See application file for complete search history.

(56) References Cited

U.S. PATENT DOCUMENTS

| | | | | |
|---|---|---|---|---|
| 6,078,205 A * | 6/2000 | Ohsawa et al. | ................ | 327/314 |
| 6,087,740 A * | 7/2000 | Williams | ....................... | 307/125 |
| 6,256,182 B1 * | 7/2001 | Suzuki et al. | ................ | 361/93.9 |
| 6,333,661 B1 * | 12/2001 | Ando et al. | .................... | 327/313 |
| 6,462,962 B1 * | 10/2002 | Cuk | ................................. | 363/16 |
| 7,482,853 B2 * | 1/2009 | Koch et al. | .................... | 327/407 |
| 7,910,993 B2 * | 3/2011 | Brindle et al. | ................ | 257/347 |
| 8,143,934 B1 * | 3/2012 | Shutt et al. | .................... | 327/404 |
| 2005/0083108 A1 * | 4/2005 | Kiriaki | ........................ | 327/408 |
| 2008/0316367 A1 * | 12/2008 | Vasella | ........................ | 348/706 |

FOREIGN PATENT DOCUMENTS

JP    2010-166793    7/2010

* cited by examiner

*Primary Examiner* — Quan Tra
(74) *Attorney, Agent, or Firm* — Robert F. Hightower

(57) ABSTRACT

A fourth n-channel MOSFET has a source terminal and a back-gate terminal connected to each other. A switch element is connected between the source terminal of the fourth n-channel MOSFET and a ground potential, and the source terminal of the fourth n-channel MOSFET is made become the ground potential when the fourth n-channel MOSFET is OFF. A protection circuit is provided between a connection node of the source terminal of the fourth n-channel MOSFET and an input terminal of the switch element, and the ground potential so that a negative inflow current from the drain terminal of the fourth n-channel MOSFET caused by electrostatic discharge flows to the ground potential.

19 Claims, 9 Drawing Sheets

SWITCH AND SWITCH CIRCUIT USING THE SAME

This application is based upon and claims the benefit of priority from the prior Japanese Patent Application No. 2011-066490, filed on Mar. 24, 2011, the entire content is incorporated herein by reference.

BACKGROUND OF THE INVENTION

1. Field of the Invention

The present invention relates to a switch for switching a signal having amplitudes on the positive side and the negative side, and a switch circuit using the switch.

2. Description of the Related Art

An analog audio signal has amplitudes on the positive side and the negative side relative to 0 V (ground potential). Therefore, in a switch for switching a signal having amplitudes on the positive side and the negative side like an analog audio signal, symmetry in a pass characteristic between the positive side and the negative side is required. In general, to a gate terminal of a MOSFET (here, an n-channel MOSFET is assumed) that is used as a switch, a high-level voltage (for example, a power supply potential) is applied as an ON signal and a low-level voltage (for example, a ground potential) is applied as an OFF signal.

The MOSFET has a characteristic in which, if a source voltage increases, a threshold voltage Vt increases, and impedance between a source and a drain increases. Therefore, in a signal having amplitudes on the positive side and the negative side, it becomes easier for the positive amplitude to be distorted with respect to the negative amplitude.

In contrast with this, in order to make the voltage between the gate and the source and the voltage between the back-gate and the source constant for suppressing a variation in the threshold voltage Vt, the gate terminal and the source terminal are connected and the back-gate terminal (called a body terminal or a bulk terminal) and the source terminal are connected. However, if the back-gate terminal and the source terminal are connected, a parasitic diode is formed between the source and the drain. In this connection form, even if the gate terminal is turned off, a negative current flows from the drain terminal toward the source terminal through the parasitic diode.

In a case where a switch using a MOSFET having the above-mentioned connection form is used on an insertion path of an external device (for example, a headphone, a microphone, or the like), a connector portion of the path is often exposed to the outside, and thus the switch is easily influenced by electrostatic discharge (ESD). In general, when switches are ON, sufficient measures are often taken against an inflow ESD current, but when switches are OFF, sufficient measures are not often taken against inflow negative currents based on ESD through parasitic diodes generated in transistors for the switches.

SUMMARY OF THE INVENTION

A switch of an aspect of the present invention is a switch that switches a signal having amplitudes on a positive side and a negative side, and includes a first transistor that has a source terminal and a back-gate terminal connected to each other, a switch element that is connected between the source terminal of the first transistor and a ground potential, and makes the source terminal of the first transistor become the ground potential when the first transistor is OFF, and a protection circuit that is provided between a connection node of the source terminal of the first transistor and an input terminal of the switch element, and the ground potential, and flows a negative inflow current from a drain terminal of the first transistor according to electrostatic discharge to the ground potential.

Another aspect of the present invention is a switch circuit. The switch circuit which is mounted in a device having a common terminal that allows a terminal of a cable capable of transmitting high-frequency signals and a terminal of a cable dedicated to transmit audio signals to be commonly inserted, and includes a high-frequency-system switch that can switch whether to pass a high-frequency signal, and an audio-system switch that is dedicated to switch whether to pass an audio signal. A signal line from the common terminal branches into two signal lines, which are connected to one end of the high-frequency-system switch and one end of the audio-system switch of a first hierarchy, a signal line from the other end of the high-frequency-system switch is connected to a target circuit, a signal line from the other end of the audio-system switch of the first hierarchy branches into a plurality of signal lines, each of which is connected to one-side end of a plurality of audio-system switches of a second hierarchy, and respective signal lines from the other ends of the plurality of audio-system switches of the second hierarchy are connected to their target circuits, the above-mentioned switch is used as the audio-system switch of the first hierarchy, and the drain terminal of the first transistor is connected to the common terminal, and the source terminal of the first transistor is connected to the one-side ends of the plurality of audio-system switches of the second hierarchy.

DETAILED DESCRIPTION OF THE INVENTION

The invention will now be described by reference to the preferred embodiments. This does not intend to limit the scope of the present invention, but to exemplify the invention.

Figure 1A:
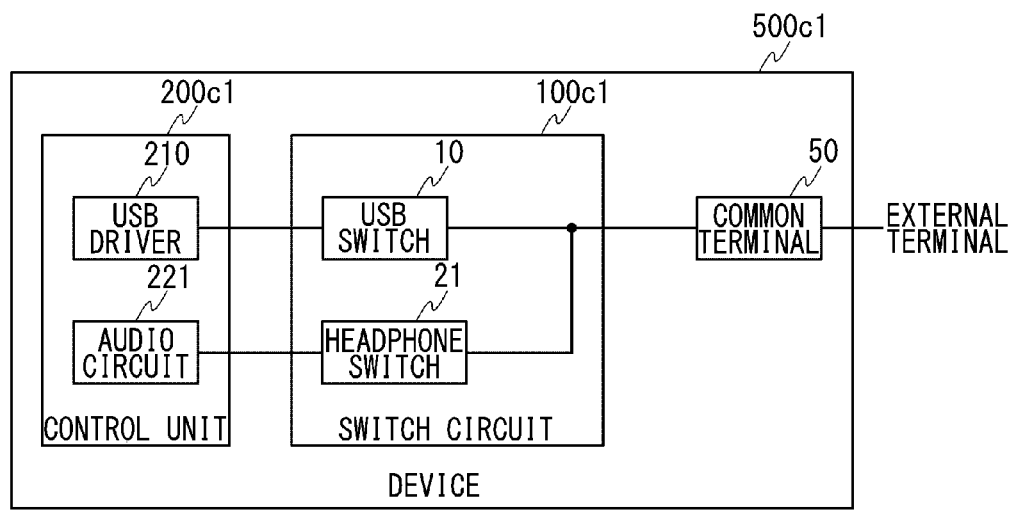
FIGS. 1A and 1B are block diagrams for describing switch circuits to be compared with a switch circuit according to an embodiment of the present invention.
Figure 1B:
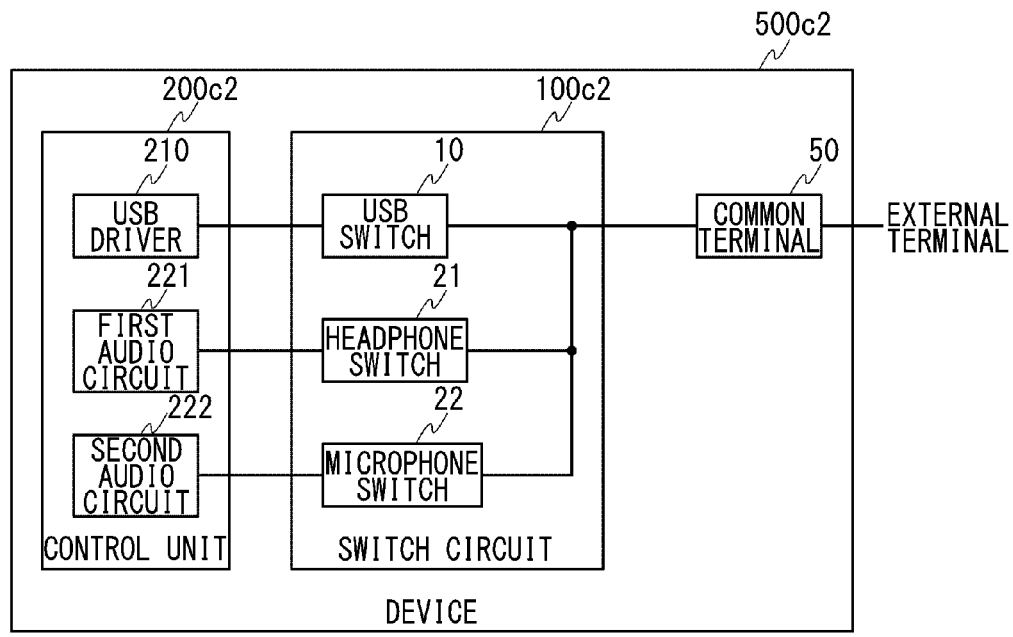

FIGS. 1A and 1B are block diagrams for describing switch circuits to be compared with a switch circuit according to an embodiment of the present invention. FIG. 1A is a block diagram for describing a switch circuit 100c1 according to a first comparative example. In the present specification, a device 500c1 will be described below as an example of a portable phone. The device 500c1 includes a control unit 200c1, the switch circuit 100c1, and a common terminal 50. The control unit 200c1 includes a USB driver 210 and an audio circuit 221. The switch circuit 100c1 includes a USB switch 10 and a headphone switch 21.

The common terminal 50 allows a terminal of a cable capable of transmitting high-frequency signals (for example, a terminal of a USB cable) and a terminal of a cable dedicated to transmit audio signals (for example, a terminal of a headphone cable) to be commonly inserted.

In the present specification, a D− terminal and a D+ terminal of a USB connector will be described as an example of the common terminal 50. The USB connector further includes a power supply terminal and a ground terminal, and is formed with a total of four pins. A micro USB connector further includes an ID terminal, and is formed with a total of five pins.

The switch circuit 100c1 includes a high-frequency-system switch capable of switching whether to pass high-frequency signals, and an audio-system switch dedicated to switch whether to pass audio signals. In the present specification, an example in which both of the high-frequency-system switch and the audio-system switch are composed of metal-oxide-semiconductor field-effect transistors (MOSFETs) will be described below.

It is necessary to use a transistor having low ON resistance of about several Ω as a transistor for switching an analog audio signal, and it is necessary to increase the size of the transistor. More specifically, it is necessary to design the transistor such that a gate width GW is large (that is, a diffusion layer is large).

Meanwhile, USB 2.0 standard supports a high-speed mode, and the high-speed mode allows transmission at a maximum bit rate of 480 Mbps. Further, USB 3.0 standard allows transmission at a maximum bit rate of 5 Gbps. Therefore, in these standards, it is possible to transmit even large-volume data such as moving image data at high speed. In order to switch this high-frequency signal, it is necessary to minimize load capacity. If the load capacity becomes large, rising edges and falling edges become blunt, and thus it becomes easier for bit errors to occur. Like this, in order to switch a high-frequency signal, it is necessary to minimize the load capacity.

In FIG. 1A, the high-frequency-system switch corresponds to the USB switch 10, and the audio-system switch corresponds to the headphone switch 21. Also, a microphone switch 22 of FIG. 1B, an audio switch 20 of FIG. 2, and a microphone switch 23 of FIG. 3 to be described below correspond to the audio-system switch.

A signal line from the common terminal 50 branches into two signal lines, which are connected to one end of the USB switch 10 and one end of the headphone switch 21, respectively. A signal line from the other end of the USB switch 10 is connected to the USB driver 210. A signal line from the other end of the headphone switch 21 is connected to the audio circuit 221.

FIG. 1B is a block diagram for describing a switch circuit 100c2 according to a second comparative example. The device 500c2 includes a control unit 200c2, the switch circuit 100c2, and a common terminal 50. The control unit 200c2 includes a USB driver 210, a first audio circuit 221, and a second audio circuit 222. The switch circuit 100c2 includes a USB switch 10, a headphone switch 21, and a microphone switch 22.

The common terminal 50 allows a terminal of a USB cable, a terminal of a headphone cable, and a terminal of a microphone cable to be commonly inserted. A signal line from the common terminal 50 branches into three signal lines, which are connected to one end of the USB switch 10, one end of the headphone switch 21, and one end of the microphone switch 22, respectively. A signal line from the other end of the USB switch 10 is connected to the USB driver 210, a signal line from the other end of the headphone switch 21 is connected to the first audio circuit 221, and a signal line from the other end of the microphone switch 22 is connected to the second audio circuit 222.

In a case where a MOSFET constituting the headphone switch 21 and a MOSFET constituting the microphone switch 22 have the same size, capacity seen from a signal line for USB in the switch circuit 100c2 according to the second comparative example becomes twice the capacity in the switch circuit 100c1 according to the first comparative example. In this case, accuracy of a waveform (eye pattern waveform) of a high-frequency signal passing through the USB switch 10 decreases.

In order to maintain the accuracy of the waveform of the high-frequency signal, if the size of each of the MOSFET constituting the headphone switch 21 and the MOSFET constituting the microphone switch 22 halves, total harmonic distortion (THD) of an audio signal passing through each of the headphone switch 21 and the microphone switch 22 almost doubles.

Figure 2:
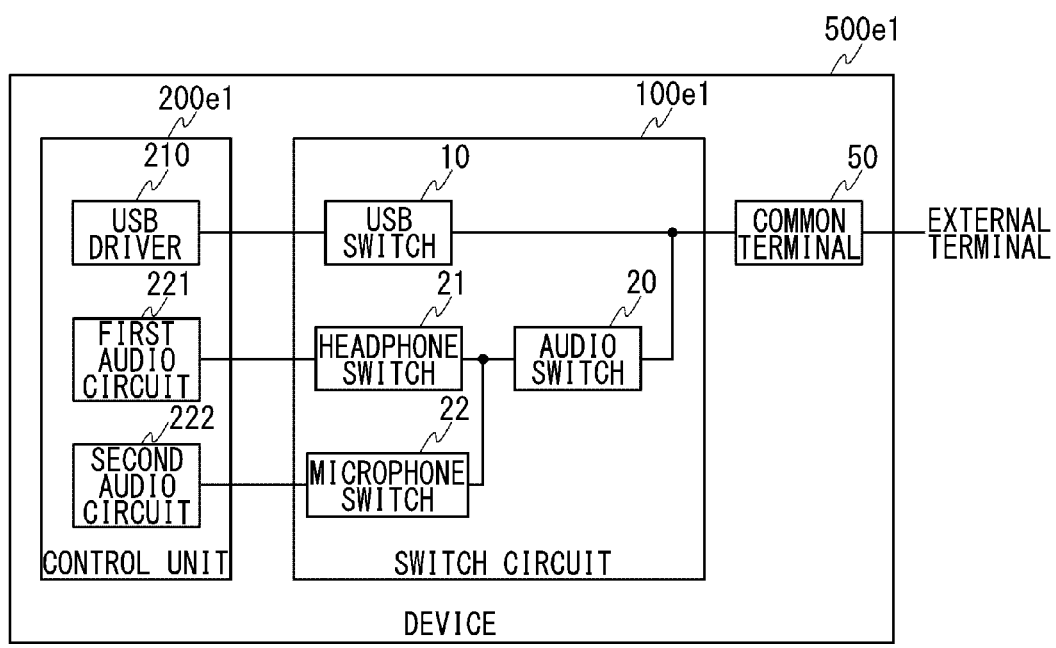
FIG. 2 is a block diagram for describing a switch circuit according to a first embodiment of the present invention.

FIG. 2 is a block diagram for describing a switch circuit 100e1 according to a first embodiment of the present invention. The device 500e1 includes a control unit 200e1, the switch circuit 100e1, and a common terminal 50. The control unit 200e1 includes a USB driver 210, a first audio circuit 221, and a second audio circuit 222. The switch circuit 100e1 includes a USB switch 10, an audio switch 20, a headphone switch 21, and a microphone switch 22.

The common terminal 50 allows a terminal of a USB cable, a terminal of a headphone cable, and a terminal of a microphone cable to be commonly inserted. A signal line from the common terminal 50 branches into two signal lines, which are connected to one end of the USB switch 10 and one end of the audio switch 20 that is a switch of a first hierarchy of the audio-system switch, respectively. A signal line from the other end of the USB switch 10 is connected to the USB driver 210.

A signal line from the other end of the audio switch 20 of the first hierarchy branches into a plurality of (two in FIG. 2) signal lines, which are connected to one-side ends of the headphone switch 21 and the microphone switch 22 that are switches of a second hierarchy of the audio-system switch, respectively. A signal line from the other end of the headphone switch 21 is connected to the first audio circuit 221, and a signal line from the other end of the microphone switch 22 is connected to the second audio circuit 222.

Figure 3:
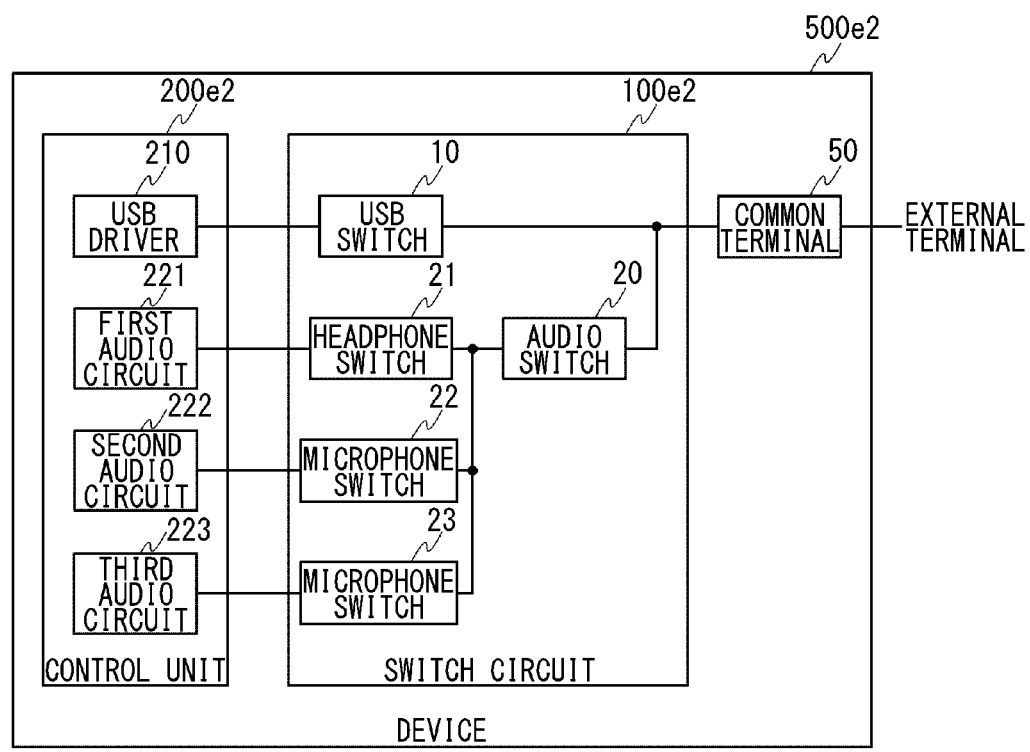
FIG. 3 is a block diagram for describing a switch circuit according to a second embodiment of the present invention.

FIG. 3 is a block diagram for describing a switch circuit 100e2 according to a second embodiment of the present invention. The second embodiment further includes one more audio circuit, as compared to the first embodiment. The added audio circuit may be a circuit for processing audio signals of other standards. In the second embodiment, a configuration having one more microphone switch as compared to the first embodiment is described. However, one more headphone switch may be added.

A device 500e2 includes a control unit 200e2, the switch circuit 100e2, and a common terminal 50. The control unit 200e2 includes a USB driver 210, a first audio circuit 221, a second audio circuit 222, and a third audio circuit 223. The switch circuit 100e2 includes a USB switch 10, an audio switch 20, a headphone switch 21, a microphone switch 22, and another microphone switch 23.

The common terminal 50 allows a terminal of a USB cable, a terminal of a headphone cable, and a terminal of a microphone cable to be commonly inserted. A signal line from the common terminal 50 branches into two signal lines, which are connected to one end of the USB switch 10, and one end of the audio switch 20 that is a switch of the first hierarchy of the audio-system switch, respectively. A signal line from the other end of the USB switch 10 is connected to the USB driver 210.

A signal line from the other end of the audio switch 20 of the first hierarchy branches into a plurality of (three in FIG. 3) signal lines, which are connected to one-side ends of the headphone switch 21, the microphone switch 22, and the microphone switch 23 that are switches of the second hierarchy of the audio-system switch, respectively. A signal line from the other end of the headphone switch 21 is connected to the first audio circuit 221, a signal line from the other end of the microphone switch 22 is connected to the second audio circuit 222, and a signal line from the other end of the microphone switch 23 is connected to the third audio circuit 223.

Capacity seen from a signal line for USB in the switch circuit 100e1 or 100e2 according to the first or second embodiment is mostly capacity of the audio switch 20, and thus is rarely influenced even if audio-system switches of the second hierarchy increase. Therefore, even if the number of the audio-system switches of the second hierarchy increases, the necessity of measures against an increase in the load capacity of the audio-system switches of the second hierarchy is low. For example, in order to suppress an increase in the load capacity, the necessity to reduce the sizes of transistors to be used as the switches is low. As long as the sizes of the transistors are not reduced, even if the number of audio-system switches of the second hierarchy increases, the quality of audio signals passing through the audio-system switches is rarely reduced.

Meanwhile, if two audio-system switches are connected in series, the THD of an audio signal passing through the two audio-system switches nearly doubles. However, in the switch circuit 100e1 or 100e2 according to the first or second embodiment, even if the number of audio circuits and/or audio wire lines increases, three or more audio-system switches are not connected in series.

Even if audio-system switches are connected in a hierarchy and the number of audio circuits and/or audio wire lines increases, it is possible to maintain both of the quality of audio signals passing through the audio-system switches and the quality of high-frequency signals passing through the high-frequency-system switch.

Figure 4:
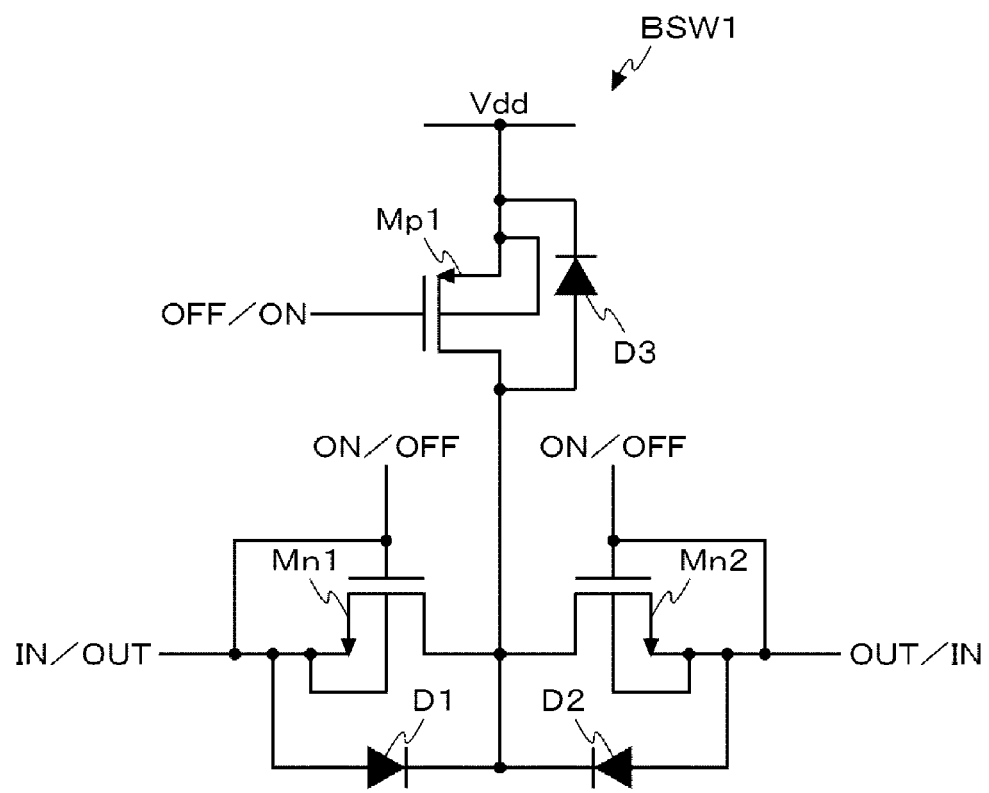
FIG. 4 is a diagram illustrating a first configuration example of a switch applicable to a switch circuit according an embodiment of the present invention.

FIG. 4 is a diagram illustrating a first configuration example of a switch applicable to a switch circuit according to an embodiment of the present invention. An analog audio signal has an amplitude between a positive side and a negative side relative to 0 V (ground potential). Therefore, the symmetry of a pass characteristic between the positive side and the negative side is required. In general, to a gate terminal of a MOSFET (here, an n-channel MOSFET is assumed) used for a switch, a high-level voltage (for example, a power supply potential) is applied as an ON signal, and a low-level voltage (for example, a ground potential) is applied as an OFF signal.

A MOSFET has the following property: if the source voltage increases, the threshold voltage Vt increases, and impedance between the source and the drain increases. Therefore, in an analog audio signal, it becomes easier for a positive amplitude to be distorted with respect to a negative amplitude.

In contrast with this, in order to make the voltage between the gate and the source, and the voltage between the back-gate and the source constant for suppressing a variation in the threshold voltage Vt, the configuration that the gate terminal and the source terminal are connected and the back-gate terminal and the source terminal are connected is used. However, if the back-gate terminal and the source terminal are connected, a parasitic diode is formed between the source and the drain. This parasitic diode is formed in a forward direction from the source to the drain, and thus an input signal from the source to the drain may not be turned off.

Under the above circumstance, a first bidirectional switch BSW1 according to the first configuration example illustrated in FIG. 4 will be described. In order that an input signal from the source to the drain can be turned off, that is, MOSFETs can be used as a bidirectional switch, two MOSFETs are connected in series so as to constitute a first bidirectional switch BSW1.

In the first configuration example, a drain terminal of a first n-channel MOSFET Mn1 and a drain terminal of a second n-channel MOSFET Mn2 are connected such that the first bidirectional switch BSW1 is configured. A gate terminal and a source terminal of the first n-channel MOSFET Mn1 are connected. In FIG. 4, both of the gate terminal and the source terminal of the first n-channel MOSFET Mn1 are directly connected. However, actually, they are connected through a capacitor or other elements. A back-gate terminal and the source terminal of the first n-channel MOSFET Mn1 are connected. Therefore, a first parasitic diode D1 is formed between the source terminal and the drain terminal of the first n-channel MOSFET Mn1. In the first parasitic diode D1, the source terminal side becomes an anode, and the drain terminal side becomes a cathode.

The second n-channel MOSFET Mn2 also has the same connection form as that of the first n-channel MOSFET Mn1. Therefore, a second parasitic diode D2 is formed between the source terminal and the drain terminal of the second n-channel MOSFET Mn2.

A first p-channel MOSFET Mp1 is inserted between the connection node of the drain terminal of the first n-channel MOSFET Mn1 and the drain terminal of the second n-channel MOSFET Mn2, and a power supply potential Vdd. The first p-channel MOSFET Mp1 has a source terminal connected to the power supply potential Vdd, a drain terminal connected to the above-mentioned connection node, and a gate terminal that receives a switching signal. A back-gate terminal and the source terminal of the first p-channel MOSFET Mp1 are connected. Therefore, a third parasitic diode D3 is formed between the source terminal and the drain terminal of the first p-channel MOSFET Mp1.

When control is performed such that the first bidirectional switch BSW1 is turned on, an ON signal (high-level voltage) is input to the gate terminals of the first n-channel MOSFET Mn1 and the second n-channel MOSFET Mn2, and an OFF signal (high-level voltage) is input to the gate terminal of the first p-channel MOSFET Mp1. Meanwhile, when control is performed such that the first bidirectional switch BSW1 is turned off, an OFF signal (low-level voltage) is input to the gate terminals of the first n-channel MOSFET Mn1 and the second n-channel MOSFET Mn2, and an ON signal (low-level voltage) is input to the gate terminal of the first p-channel MOSFET Mp1.

In the first bidirectional switch BSW1, the cathode of the first parasitic diode D1 and the cathode of the second parasitic diode D2 face each other. Therefore, when control is performed such that the first n-channel MOSFET Mn1 and the second n-channel MOSFET Mn2 are turned on, a current dose not flow in any direction in the first bidirectional switch BSW1 through the first parasitic diode D1 and the second parasitic diode D2. Further, when control is performed such that the first bidirectional switch BSW1 is turned off, the cathodes of the first parasitic diode D1 and the second parasitic diode D2 become the power supply potential Vdd by the first p-channel MOSFET Mp1. Therefore, as long as a voltage higher than the power supply potential Vdd is not applied to the anode of the first parasitic diode D1 or the anode of the second parasitic diode D2, any current does not flow in the first parasitic diode D1 and the second parasitic diode D2.

Also, it is preferable to use MOSFETs with high ESD withstand voltage for the first n-channel MOSFET Mn1 and the second n-channel MOSFET Mn2. When the first n-channel MOSFET Mn1 and the second n-channel MOSFET Mn2 are OFF, even if a high ESD voltage is applied, an ESD current can be interrupted by the first n-channel MOSFET Mn1 and the second n-channel MOSFET Mn2. Further, a positive ESD current flows into the first parasitic diode D1 or the second parasitic diode D2, but leaks into the power supply potential Vdd through the first p-channel MOSFET Mp1.

Figure 5:
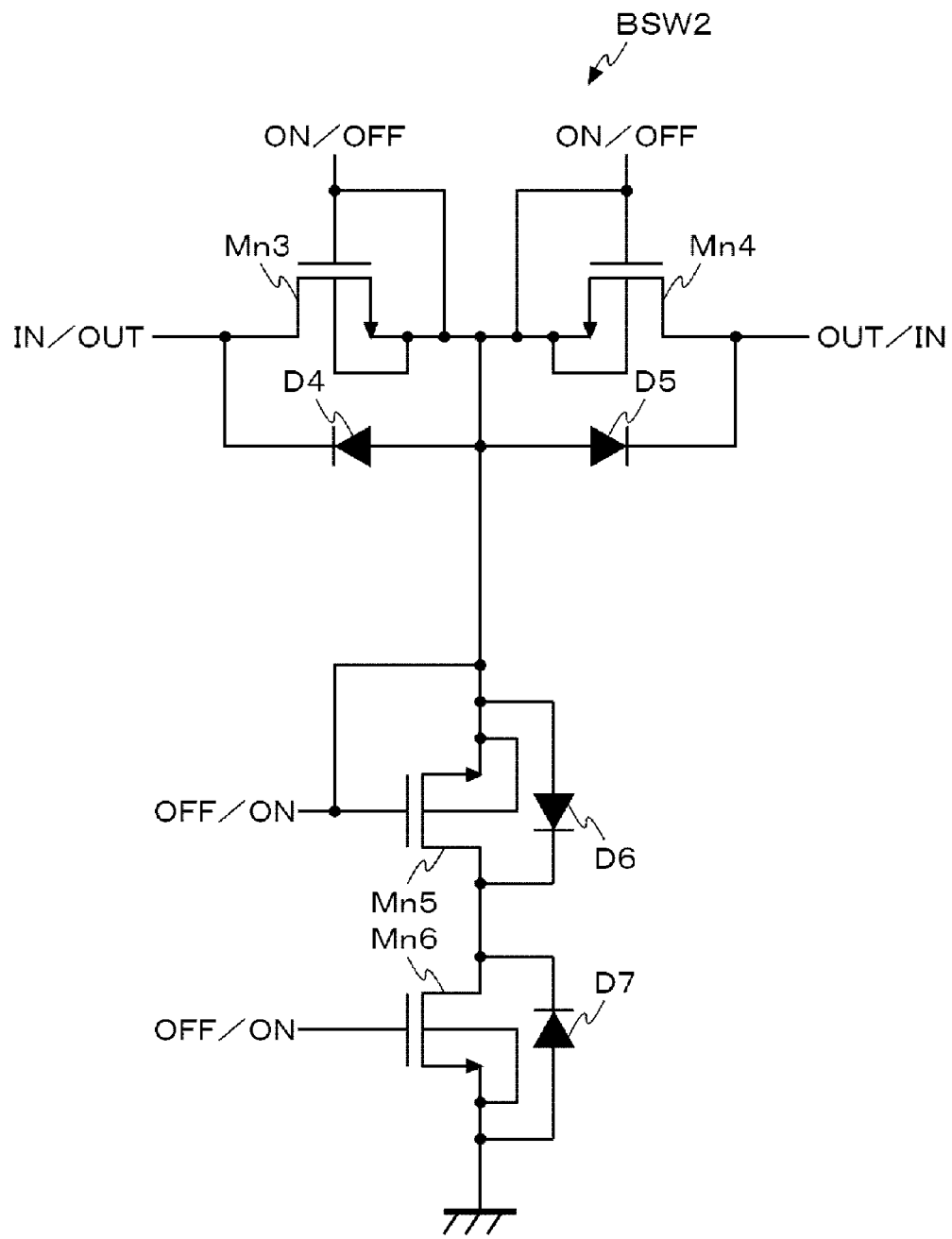
FIG. 5 is a circuit diagram illustrating a second configuration example of the switch circuit applicable to a switch circuit according to an embodiment of the present invention.

FIG. 5 is a circuit diagram illustrating a second configuration example of a switch applicable to a switch circuit according to an embodiment of the present invention. Even in the second configuration example illustrated in FIG. 5, two MOSFETs are connected in series, so as to constitute a second bidirectional switch BSW2.

In the second configuration example, a source terminal of a third n-channel MOSFET Mn3 and a source terminal of a fourth n-channel MOSFET Mn4 are connected, such that a second bidirectional switch BSW2 is configured. Also, similarly to the first configuration example, it is preferable to use MOSFETs with high ESD withstand voltage for the third n-channel MOSFET Mn3 and the fourth n-channel MOSFET Mn4.

The gate terminal and the source terminal of the third n-channel MOSFET Mn3 are connected so as to operate in conjunction with each other, and the back-gate terminal and the source terminal of the third n-channel MOSFET Mn3 are connected. Therefore, a fourth parasitic diode D4 is formed between the source terminal and the drain terminal of the third n-channel MOSFET Mn3. In FIG. 5, both of the gate terminal and the source terminal of the third n-channel MOSFET Mn3 are directly connected, however, actually, they are connected through a capacitor or other elements.

The fourth n-channel MOSFET Mn4 also has the same connection form as that of the third n-channel MOSFET Mn3. Therefore, a fifth parasitic diode D5 is formed between the source terminal and the drain terminal of the fourth n-channel MOSFET Mn4.

A serial circuit configured by a fifth n-channel MOSFET Mn5 and a sixth n-channel MOSFET Mn6 is inserted between the connection node of the source terminal of the third n-channel MOSFET Mn3 and the source terminal of the fourth n-channel MOSFET Mn4, and the ground potential. The serial circuit functions as a switch element for making the source terminals of the third n-channel MOSFET Mn3 and the fourth n-channel MOSFET Mn4 become the ground potential when the third n-channel MOSFET Mn3 and the fourth n-channel MOSFET Mn4 are OFF.

The source terminal of the fifth n-channel MOSFET Mn5 is connected to the source terminals of the third n-channel MOSFET Mn3 and the fourth n-channel MOSFET Mn4, and the drain terminal of the fifth n-channel MOSFET Mn5 is connected to the drain terminal of the sixth n-channel MOSFET Mn6. The gate terminal of the fifth n-channel MOSFET Mn5 receives a switching signal.

Further, the gate terminal and the source terminal of the fifth n-channel MOSFET Mn5 are connected through a transistor having a gate terminal that receives a fixed potential, or other elements, and the back-gate terminal and the source terminal of the fifth n-channel MOSFET Mn5 are connected. Therefore, a sixth parasitic diode D6 is formed between the source terminal and the drain terminal of the fifth n-channel MOSFET Mn5.

The source terminal of the sixth n-channel MOSFET Mn6 is connected to the ground potential, the drain terminal of the sixth n-channel MOSFET Mn6 is connected to the drain terminal of the fifth n-channel MOSFET Mn5, and the gate terminal of the sixth n-channel MOSFET Mn6 receives a switching signal. The back-gate terminal and the source terminal of the sixth n-channel MOSFET Mn6 are connected. Therefore, a seventh parasitic diode D7 is formed between the source terminal and the drain terminal of the sixth n-channel MOSFET Mn6.

When control is performed such that the second bidirectional switch BSW2 is turned on, an ON signal (high-level voltage) is input to the gate terminals of the third n-channel MOSFET Mn3 and the fourth n-channel MOSFET Mn4, and an OFF signal (low-level voltage) is input to the gate terminals of the fifth n-channel MOSFET Mn5 and the sixth n-channel MOSFET Mn6. Therefore, the fifth n-channel MOSFET Mn5 and the sixth n-channel MOSFET Mn6 are turned off.

Meanwhile, when control is performed such that the second bidirectional switch BSW2 is turned off, an OFF signal (low-level voltage) is input to the gate terminals of the third n-channel MOSFET Mn3 and the fourth n-channel MOSFET Mn4, and an ON signal (high-level voltage) is input to the gate terminals of the fifth n-channel MOSFET Mn5 and the sixth n-channel MOSFET Mn6. Therefore, the fifth n-channel MOSFET Mn5 and the sixth n-channel MOSFET Mn6 are turned on.

Also, in a case where only the sixth n-channel MOSFET Mn6 is provided as the above-mentioned switch element, when the third n-channel MOSFET Mn3 and the fourth n-channel MOSFET Mn4 are ON, even if the sixth n-channel MOSFET Mn6 is OFF, a negative signal becomes the ground potential by the seventh parasitic diode D7, and thus the negative signal may not be transmitted. For this reason, the fifth n-channel MOSFET Mn5 is provided, so as to prevent the negative signal from becoming the ground potential. A positive signal passes through the sixth parasitic diode D6, but is interrupted by the seventh parasitic diode D7, and thus it is possible to prevent the positive signal from becoming the ground potential.

In the second bidirectional switch BSW2, the anode of the fourth parasitic diode D4 and the anode of the fifth parasitic diode D5 face each other. Therefore, when control is performed such that the third n-channel MOSFET Mn3 and the fourth n-channel MOSFET Mn4 are turned off, a current dose not flow in any direction in the second bidirectional switch BSW2 through the fourth parasitic diode D4 and the fifth parasitic diode D5. Further, when control is performed such that the second bidirectional switch BSW2 is turned off, the fifth n-channel MOSFET Mn5 and the sixth n-channel MOSFET Mn6 are turned on, such that the anode of the fourth parasitic diode D4 and the cathode of the fifth parasitic diode D5 become the ground potential. Therefore, a negative current flows into the cathode of the fourth parasitic diode D4 or the cathode of the fifth parasitic diode D5, but a positive current does not flow thereinto.

Here, if the negative current is a low current, there is no problem. However, if the negative current is a high current, the negative current may flow in the back-gate terminal of the fifth n-channel MOSFET Mn5 so as to cause a defect in the fifth n-channel MOSFET Mn5.

Figure 6:
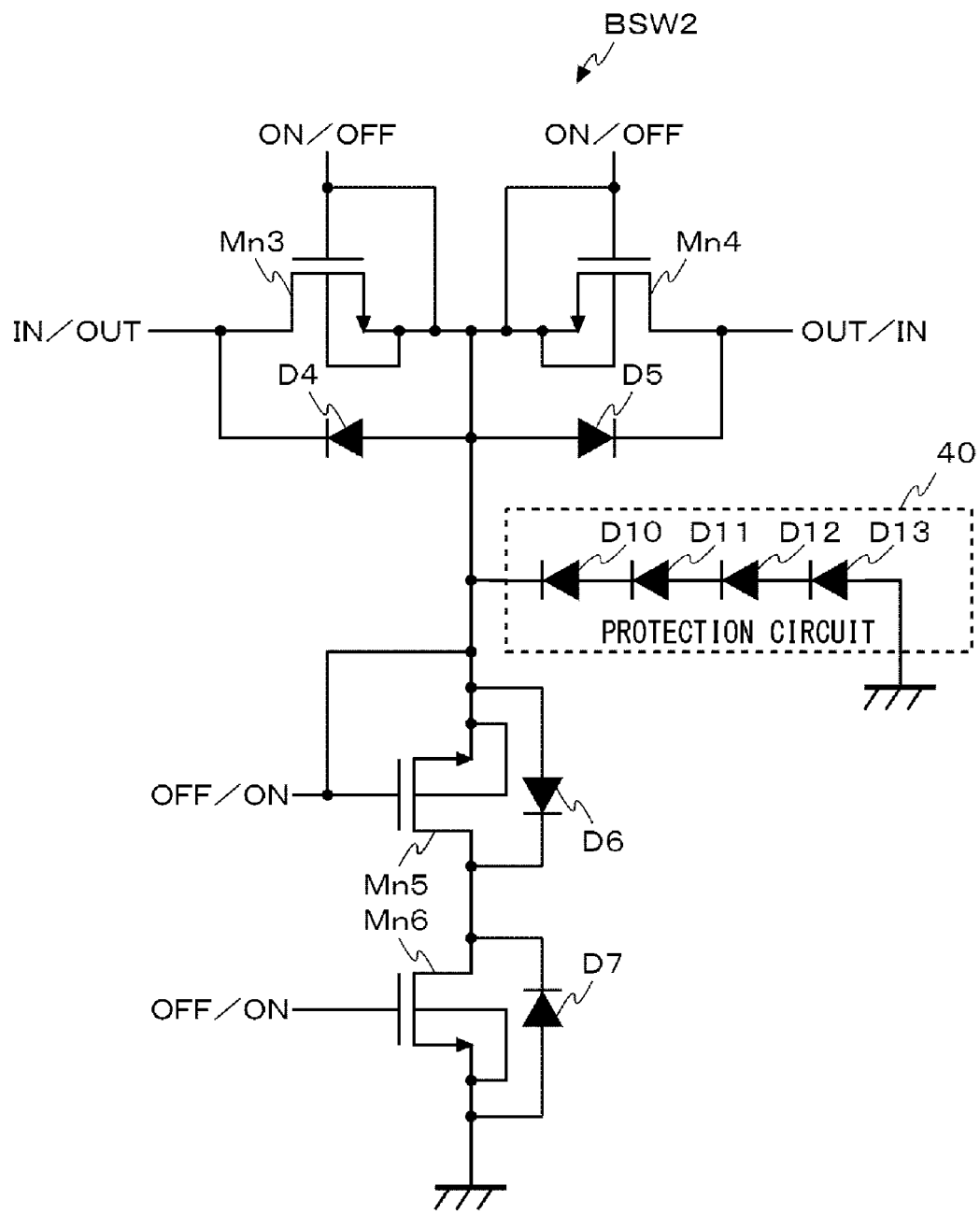
FIG. 6 is a circuit diagram illustrating the second configuration example (with a protection circuit) of the switch applicable to a switch circuit according to an embodiment of the present invention.

FIG. 6 is a circuit diagram illustrating the second configuration example (with a protection circuit) of the switch which is applicable to the switch circuit according to an embodiment of the invention. The circuit illustrated in FIG. 6 is configured by adding a protection circuit 40 to the circuit illustrated in FIG. 5. The protection circuit 40 is provided between the connection node of the source terminals of the third n-channel MOSFET Mn3 and the fourth n-channel MOSFET Mn4 and the source terminal of the fifth n-channel MOSFET Mn5, and the ground potential. The protection circuit 40 is a circuit for dissipating the negative current based on ESD, which flows into the protection circuit 40 from the drain terminal of the third n-channel MOSFET Mn3 or the fourth n-channel MOSFET Mn4, to the ground potential.

The protection circuit 40 is composed of a diode cascade circuit configured by connecting a plurality of diodes (a first protection diode D10, a second protection diode D11, a third protection diode D12, and a fourth protection diode D13 in FIG. 6) in cascade. The cathode terminal of the diode cascade circuit is connected to the above-mentioned connection node, and the anode terminal of the diode cascade circuit is connected to the ground potential.

Here, when a negative voltage within a defined range is applied to the drain terminal of the third n-channel MOSFET Mn3 or the fourth n-channel MOSFET Mn4, the total voltage of the threshold voltages of the plurality of diodes (the first protection diode D10, the second protection diode D11, the third protection diode D12, and the fourth protection diode D13 in FIG. 6) constituting the diode cascade circuit is set in the range of the negative current does not flow in the diode cascade circuit.

For example, in a case where a voltage range of the defined voltage that is applied to the drain terminal is ±1.5 V, if the diode cascade circuit flows a negative current of −1.5 V, when control is performed such that the third n-channel MOSFET Mn3 or the fourth n-channel MOSFET Mn4 is turned on, a negative signal is not correctly transmitted. Therefore, in this example, it is necessary to set the threshold voltage of the diode cascade circuit to be lower than −1.5 V. For example, in a case where a plurality of diodes having the same threshold voltage are used, and the threshold voltage is −0.6 V, it is only necessary to connect the diodes in three stages. Also, redundancy may be provided to the diode cascade circuit and the diodes may be connected in four or more stages. However, if the number of stages is too large, the circuit resistance becomes high and the diode cascade circuit does not function as the protection circuit. Further, the cost increases, and the circuit area increases. Therefore, it is necessary to set the well-balanced number of stages.

Further, a negative voltage based on ESD ranges to −3000 V. Therefore, in order to take all possible ESD measures of the negative voltage of the second bidirectional switch BSW2, it is preferable to use a MOSFET with high ESD withstand voltage for the fifth n-channel MOSFET Mn5.

Figure 7:
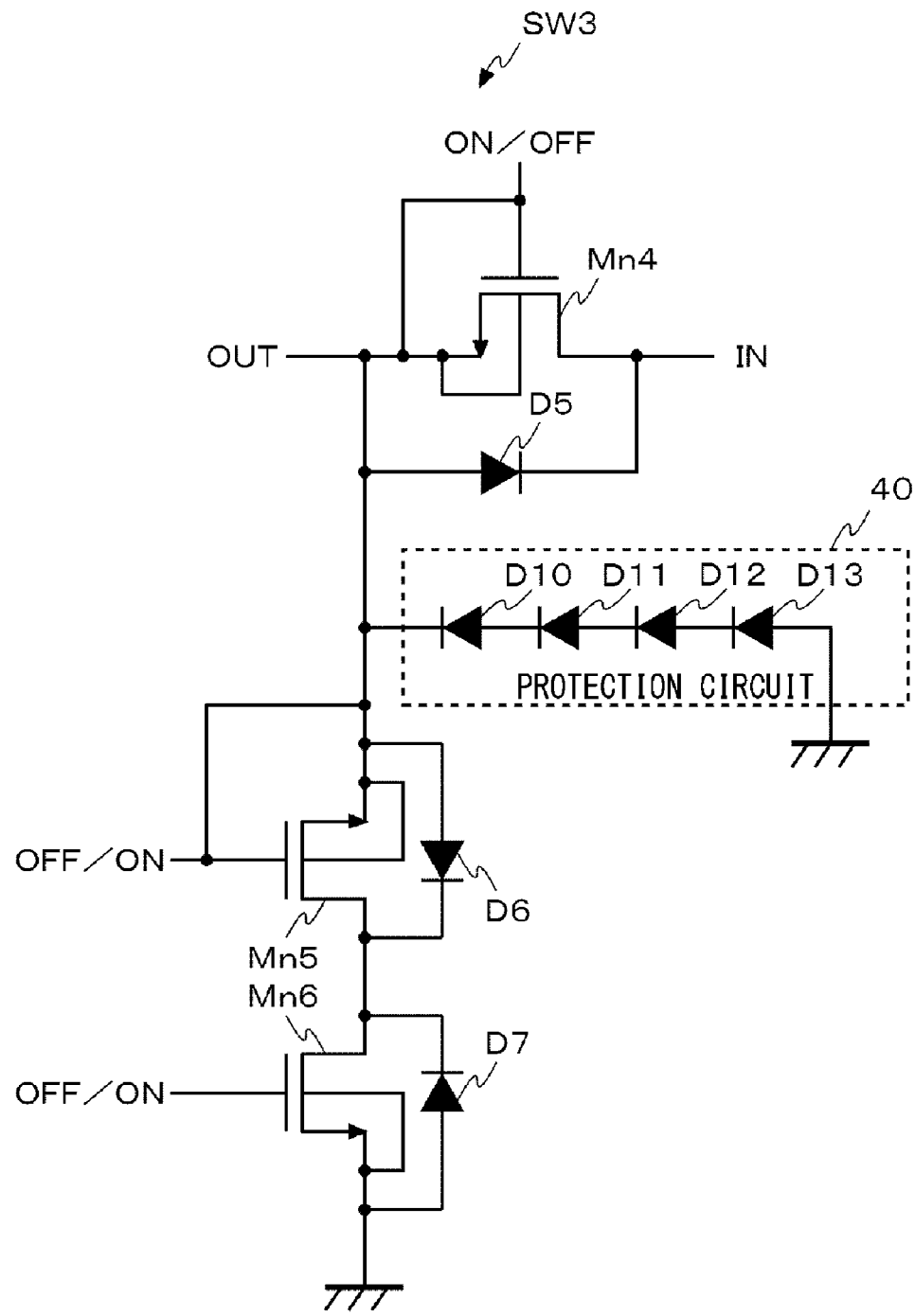
FIG. 7 is a circuit diagram illustrating a third configuration example of the switch applicable to a switch circuit according to an embodiment of the present invention.

FIG. 7 is a circuit diagram illustrating a third configuration example of the switch which is applicable to switch circuit according to an embodiment of the invention. A switch SW3 according to the third configuration example is configured by removing the third n-channel MOSFET Mn3 from the second bidirectional switch BSW2 illustrated in FIG. 6. The switch SW3 according to the third configuration example may not be used in itself as a bidirectional switch. The drain terminal of the fourth n-channel MOSFET Mn4 is connected to a signal input side, and the source terminal of the fourth n-channel MOSFET Mn4 is connected to a signal output side.

The first bidirectional switch BSW1 and the second bidirectional switch BSW2 according to the first and second configuration examples can switch input signals from two directions, and can suppress distortion of analog audio signals. Therefore, the first bidirectional switch BSW1 and the second bidirectional switch BSW2 are appropriate for a switch to be included in a switch circuit according to an embodiment of the invention.

Figure 8:
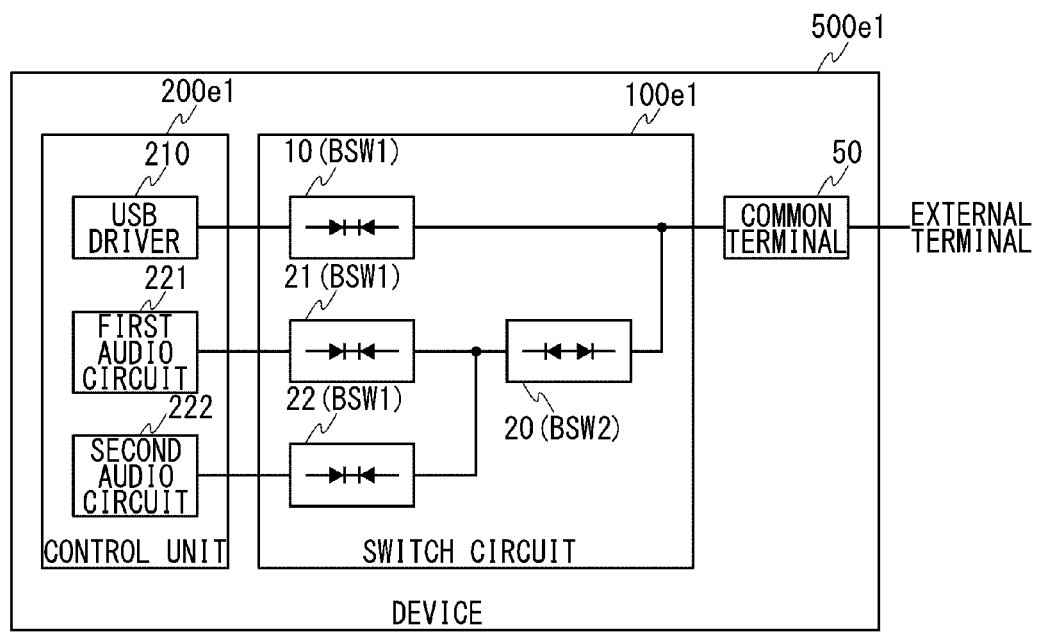
FIG. 8 is a block diagram illustrating an example of application of a first bidirectional switch and a second bidirectional switch to switches included in the switch circuit according to the first embodiment of the present invention.

FIG. 8 is a block diagram illustrating an example of application of the first bidirectional switch BSW1 and the second bidirectional switch BSW2 to a switch included in the switch circuit 100e1 according to the first embodiment of the invention. When the first bidirectional switch BSW1 is OFF, the potential of an intermediate node between the two MOSFETs is clamped at the power supply potential. Meanwhile, when the second bidirectional switch BSW2 is OFF, the potential of the intermediate node between the two MOSFETs is clamped at the ground potential.

In the switch circuit 100e1, the first bidirectional switch BSW1 is used as the high-frequency-system switch (the USB switch 10 in FIG. 8). Therefore, the second bidirectional switch BSW2 is used as a switch of a first hierarchy of the audio-system switch (the audio switch 20 in FIG. 8), and the first bidirectional switch BSW1 is used as switches (the headphone switch 21 and the microphone switch 22) of a second hierarchy.

If the first bidirectional switch BSW1 is used as a switch of the second hierarchy of the audio-system switch, it is possible to reliably prevent backflow of signals between the first audio circuit 221 and the second audio circuit 222. For example, it is assumed that the first audio circuit 221 is connected to the external terminal. In this case, the USB switch 10 is OFF, the audio switch 20 and the headphone switch 21 are ON, and the microphone switch 22 is OFF. At this time, the intermediate node of the first bidirectional switch BSW1 of the microphone switch 22 is clamped at the power supply potential. Therefore, as long as a voltage higher than the power supply voltage is not applied to the headphone switch 21, any signal to be noise does not flow from the microphone switch 22.

In a case where the second bidirectional switch BSW2 is used as switches of the second hierarchy of the audio-system switch, the following point is considered. For example, it is assumed a case where the first audio circuit 221 is connected to the external terminal. In this case, the USB switch 10 is OFF, the audio switch 20 and the headphone switch 21 are ON, and the microphone switch 22 is OFF. At this time, the intermediate node of the second bidirectional switch BSW2 of the microphone switch 22 is clamped at the ground potential. Then, since an audio signal has a waveform centered at 0 V (a waveform having a positive potential and a negative potential), when the negative potential is applied to the headphone switch 21, a current to be noise flows in a diode (the fourth parasitic diode D4 or the fifth parasitic diode D5) of the second bidirectional switch BSW2 of the microphone switch 22. Therefore, the negative potential of the headphone switch 21 is drawn to the ground potential side, and as a result, the THD of the audio signal passing through the headphone switch 21 increases.

In the present embodiment, the load capacity seen from the signal line for USB in the high-frequency-system switch is most the capacity of the switch of the first hierarchy of the audio-system switch. If the second bidirectional switch BSW2 is used as the switch of the first hierarchy of the audio-system switch with respect to the first bidirectional switch BSW1 of the high-frequency-system switch, the load capacity seen from the signal line for USB is reduced as compared to a case where the first bidirectional switch BSW1 is used as the switch of the first hierarchy.

In a case where the switch of the first hierarchy is the second bidirectional switch BSW2, since the drain terminal of the switch is connected to the signal line for USB, the load capacity seen from the signal line for USB is mainly the capacity attributable to the drain terminal (the capacity between an impurity area constituting the drain terminal and an impurity area constituting the back-gate terminal).

Meanwhile, in a case where the switch of the first hierarchy is the first bidirectional switch BSW1, since the source terminal of the switch is connected to not only the signal line for USB but also the back-gate terminal, the load capacity seen from the signal line for USB is mainly the capacity attributable to the back-gate terminal (the capacity between an impurity area constituting the back-gate terminal, and a well area or a substrate including the impurity area, the capacity between the impurity area constituting the back-gate terminal and the impurity area constituting the drain terminal, and the capacity between the impurity area constituting the back-gate terminal and the gate terminal).

Considering these factors, in the present embodiment, the second bidirectional switch BSW2 is used as the switch of the first hierarchy of the audio-system switch with respect to the first bidirectional switch BSW1 of the high-frequency-system switch.

In the application example illustrated in FIG. 8, an example in which the first bidirectional switch BSW1 used as the USB switch 10, the headphone switch 21, and the microphone switch 22 is described. Naturally, the specifications (for example, a gate width) of the first bidirectional switch BSW1 to be used as each of the switches differ depending on the specification of signals to pass through the switches and the specifications of a circuit to input and output those signals.

Figure 9:
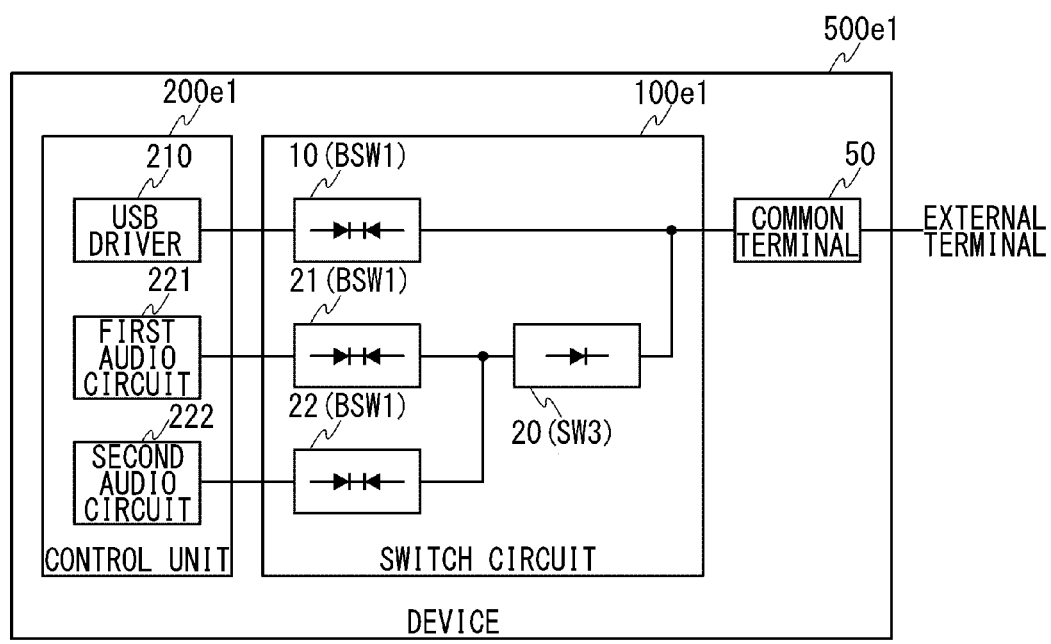
FIG. 9 is a block diagram illustrating an example of application of a first bidirectional switch and a third switch to the switches included in the switch circuit according to the first embodiment of the present invention.

FIG. 9 is a block diagram illustrating an example of application of the first bidirectional switch BSW1 and a third switch SW3 to a switch included in the switch circuit 100e1 according to the first embodiment of the present invention. In FIG. 8, the example in which the second bidirectional switch BSW2 is applied to the audio switch 20 has been described. That example is more superior to the example in which the first bidirectional switch BSW1 is applied to the audio switch 20. However, as long as two MOSFETs are used, impedance from the common terminal 50 to the audio circuit is higher than that in a case where one MOSFET is used.

Here, the third switch SW3 illustrated in FIG. 7 is applied to the audio switch 20. Further, a negative signal input from the external terminal to the first audio circuit 221 or the second audio circuit 222 cannot be interrupted by the switch SW3 alone, but can be interrupted by the first bidirectional switch BSW1 applied to the headphone switch 21 and the microphone switch 22. Also, a signal output from the first audio circuit 221 or the second audio circuit 222 to the external terminal can be interrupted by the first bidirectional switch BSW1 applied to the headphone switch 21 and the microphone switch 22.

As described above, according to the present embodiment, the diode cascade circuit connected to the ground potential is connected to the connection node of a source terminal of a transistor for a switch and a switch element for clamping the source terminal at the ground potential. Therefore, it is possible to protect the internal circuits from a negative current caused by ESD that flows into the switch element through the parasitic diode generated in the above-mentioned transistor.

Further, if the switch SW3 of FIG. 7 is applied to the audio switch 20 as illustrated in FIG. 9, it is possible to suppress distortion components generated in high-frequency signals and audio signals. Further, the common terminal 50 may be exposed to the outside, and thus the audio switch 20 is vulnerable to ESD. Therefore, if the switch SW3 of FIG. 7 is applied to the audio switch 20, it is possible to protect the internal circuits from a negative current caused by ESD. The same equally applies to a case where the second bidirectional switch BSW2 in FIG. 6 is applied to the audio switch 20.

The present invention has been described with reference to the embodiments. The embodiments are illustrative, and those skilled in the art can understand that various modifications are possible in combinations of the components and processes, and those modifications are within the scope of the present invention.

In the above-mentioned embodiments, examples in which the switch circuit 100e1 or 100e2 is mounted on a portable device such as a portable phone have been described. However, the switch circuit 100e1 or 100e2 can be applied to not only portable devices but also all electronic devices if the devices need simplification of connectors from viewpoints of design, prevention of erroneous insertion, and the like.

What is claimed is:

1. A switch which switches a signal having amplitudes on a positive side and a negative side, comprising:
   a first transistor that has a source terminal and a back-gate terminal coupled to each other;
   a switch element that is coupled between a ground potential and a first node that is coupled to the source and gate terminals of the first transistor, and wherein the switch element and the first transistor are operated with control signals that are opposite in phase with each other and makes the source terminal of the first transistor become the ground potential when the first transistor is OFF, the switch element including a parasitic diode, wherein the switch element includes a second transistor that has a source terminal and a back-gate terminal coupled to each other, a third transistor that has a source terminal and a back-gate terminal coupled to each other, and wherein the source terminal of the second transistor is coupled to the source terminal of the first transistor, the source terminal of the third transistor is coupled to the ground potential, and a drain terminal of the second transistor is coupled to a drain terminal of the third transistor; and
   a protection circuit that is provided between a connection node of the source terminal of the first transistor and an input terminal of the switch element, and the ground potential so that a negative inflow current from a drain terminal of the first transistor caused by electrostatic discharge flows to the ground potential.

2. A switch which switches a signal having amplitudes on a positive side and a negative side, comprising:
   a first transistor that has a source terminal and a back-gate terminal connected to each other;
   a switch element that is connected between a ground potential and the source and gate terminals of the first transistor, and wherein the switch element and the first transistor are operated with control signals that are opposite in phase with each other and makes the source terminal of the first transistor become the ground potential when the first transistor is OFF, wherein the switch element includes a second transistor having a source and back-gate terminal coupled together and a third transistor having a source and back-gate terminal coupled together, the second and third transistors coupled in series with a control electrode of the second transistor coupled to a control electrode of the third transistor and operably coupled to control the second and third transistors to be OFF when the first transistor is ON and vice versa; and a protection circuit that is provided between a connection node of the source terminal of the first transistor and an input terminal of the switch element, and the ground potential so that a negative inflow current from a drain terminal of the first transistor caused by electrostatic discharge flows to the ground potential, the protection circuit including a diode cascade circuit configured by connecting a plurality of diodes in cascade, and the cathode terminal of the diode cascade circuit is connected to the connection node, and the anode terminal of the diode cascade circuit is connected to the ground potential.

3. The switch according to claim 2, wherein the total voltage of threshold voltages of the plurality of diodes constituting the diode cascade circuit is set such that, when a negative voltage of a defined range is applied to the drain terminal of the first transistor, a negative current does not flow in the diode cascade circuit.

4. The switch according to claim 1, further comprising: a fourth transistor that has a source terminal and a back-gate terminal coupled to each other, wherein the source terminal of the first transistor is coupled to the source terminal of the fourth transistor.

5. A switch circuit which is mounted in a device having a common terminal that allows a terminal of a cable capable of transmitting high-frequency signals and a terminal of a cable configured to transmit audio signals only to be commonly inserted, comprising:

a high-frequency-system switch that can switch whether or not to pass a high-frequency signal;

an audio-system switch that is dedicated to switch whether or not to pass an audio signal, wherein a signal line from the common terminal branches into two signal lines, one of which is coupled to one end of the high-frequency-system switch and the other is coupled to one end of the audio-system switch of a first hierarchy, a signal line from the other end of the high-frequency-system switch is coupled to a target circuit, a signal line from the other end of the audio-system switch of the first hierarchy branches into a plurality of signal lines, which are respectively connected to one-side ends of a plurality of audio-system switches of a second hierarchy, and respective signal lines from the other ends of the plurality of audio-system switches of the second hierarchy are coupled to their target circuits, the drain terminal of the first transistor is coupled to the common terminal, and the source terminal of the first transistor is coupled to the one-side ends of the plurality of audio-system switches of the second hierarchy; and a first transistor that has a source terminal and a back-gate terminal coupled to each other;

a switch element that is coupled between a ground potential and the source and gate terminals of the first transistor, and wherein the switch element and the first transistor are operated with control signals that are opposite in phase with each other and makes the source terminal of the first transistor become the ground potential when the first transistor is OFF, the switch element including a parasitic diode, wherein the switch element includes a second transistor having a source and back-gate terminal coupled together and a third transistor having a source and back-gate terminal coupled together, the second and third transistors coupled in series with a control electrode of the second transistor coupled to a control electrode of the third transistor and operably coupled to control the second and third transistors to be OFF when the first transistor is ON and vice versa; and a protection circuit that is provided between a connection node of the source terminal of the first transistor and an input terminal of the switch element, and the ground potential so that a negative inflow current from a drain terminal of the first transistor caused by electrostatic discharge flows to the ground potential.

6. The switch of claim 1 wherein the parasitic diode is coupled in parallel with the switch element.

7. The switch of claim 1 further including a fourth transistor coupled in series with the first transistor.

8. The switch of claim 1 wherein the second transistor includes the parasitic diode and the third transistor includes another parasitic diode.

9. The switch of claim 1 wherein the second and third transistors are operably coupled to be controlled opposite to states of the first transistor.

10. The switch of claim 1 further including the second and third transistors having respective control electrodes coupled to operate the second and third transistors oppositely to the first transistor.

11. The switch of claim 1 further including a control electrode of the second transistor coupled to a control electrode of the third transistor and operably coupled to control the second and third transistors to be OFF when the first transistor is ON and vice versa.

12. The switch of claim 1 wherein the protection circuit is coupled between the ground potential and the connection node wherein the connection node is connected to the source of the terminal of the first transistor and is also coupled to the input terminal of the switch element, the connection node also connected to the first node.

13. The switch of claim 1 wherein the first transistor is configured for passing the signal having amplitudes on the positive side and the negative side relative to the ground potential.

14. The switch of claim 1 wherein the switch element configured to couple a common signal to the source and gate terminals of the first switch.

15. The switch of claim 2 wherein the protection circuit is coupled between the ground potential and the connection node wherein the connection node is connected to the source of the terminal of the first transistor and is also coupled to the input terminal of the switch element.

16. The switch of claim 2 wherein the first transistor is configured for passing the signal having amplitudes on the positive side and the negative side relative to the ground potential.

17. The switch of claim 2 wherein the switch element configured to couple a common signal to the source and gate terminals of the first switch.

18. The switch of claim 5 wherein the protection circuit is coupled between the ground potential and the connection node wherein the connection node is connected to the source of the terminal of the first transistor and is also coupled to the input terminal of the switch element.

19. The switch of claim 5 wherein the first transistor is configured for passing the signal having amplitudes on the positive side and the negative side relative to the ground potential.

* * * * *